United States Patent
Mahoney

[11] Patent Number: 6,147,310
[45] Date of Patent: Nov. 14, 2000

[54] INSULATIVE HOLDER FOR AN ELECTRONIC COMPONENT

[75] Inventor: William G. Mahoney, Suwanee, Ga.

[73] Assignee: Scientific-Atlanta, Inc., Norcross, Ga.

[21] Appl. No.: 09/160,507

[22] Filed: Sep. 24, 1998

[51] Int. Cl.⁷ .................................................. H01B 17/00
[52] U.S. Cl. ..................... 174/138 G; 338/232; 361/742; 361/767; 361/770
[58] Field of Search ........................... 174/138 R, 138 F, 174/138 G, 135, 52.6, 138 H, 138 J; 361/807, 809, 810, 811, 812, 742, 767, 770; 338/22 R, 25, 220, 221, 276, 232, 234, 235, 236

[56] References Cited

U.S. PATENT DOCUMENTS

| | | | |
|---|---|---|---|
| D. 248,751 | 8/1978 | Nakamura | 174/138 F |
| 2,659,061 | 11/1953 | Mirabella | 174/138 G |
| 3,184,536 | 5/1965 | Vincent | 174/138 G |
| 3,259,813 | 7/1966 | Lindstrand | 174/138 G |
| 4,206,435 | 6/1980 | Harris et al. | 174/138 F |
| 4,362,904 | 12/1982 | Schneider et al. | 361/770 |
| 4,667,270 | 5/1987 | Yagi | 361/807 |
| 4,939,498 | 7/1990 | Yamada et al. | 338/22 R |
| 4,962,442 | 10/1990 | Clemens | 361/767 |
| 5,233,326 | 8/1993 | Motoyoshi | 338/220 |
| 5,760,336 | 6/1998 | Wang | 338/234 |
| 5,945,903 | 9/1999 | Reddy et al. | 338/22 R |

*Primary Examiner*—Kristine Kincaid
*Assistant Examiner*—Aldolfo Nino
*Attorney, Agent, or Firm*—Kelly A. Gardner; Kenneth M. Massaroni; Hubert J. Barnhardt, III

[57] ABSTRACT

A holder (200) for holding an electronic component (100), which can be inserted into and removed from the holder (200), is formed to be both electrically and thermally insulative. The holder (200) is formed from an insulative body molded to form a cavity (205) into which the electronic component (100) can be inserted. The insulative body includes sidewalls (210) formed to partially enclose the electronic component (100) when it is inserted into the holder (200) and a bottom surface (250) formed perpendicularly with the sidewalls (210). The bottom surface (250) defines at least two apertures (225) through which terminals (110) of the electronic component (100) can extend.

18 Claims, 1 Drawing Sheet

INSULATIVE HOLDER FOR AN ELECTRONIC COMPONENT

FIELD OF THE INVENTION

This invention relates generally to electronic components, and more specifically to holders for containing electronic components.

BACKGROUND OF THE INVENTION

Electrical equipment, such as amplifiers, taps, and other cable television equipment, typically includes a number of electronic components, such as positive temperature coefficient (PTC) devices, that may be situated near metallic or conductive surfaces. Such electronic components, in particular a PTC device, can be hot to the touch after operation of the electrical equipment for a period of time. Many of the electronic components also include surface materials that are electrically conductive during operation of the electrical equipment. In such a situation, mounting the electronic component near conductive surfaces of the electrical equipment can, if contact is made, cause operational problems and cause failure of the electronic components and other components within the equipment. If this should occur, removal and replacement of the component can be difficult since the high temperature of the component can render removal thereof both painful and unsafe.

Thus, what is needed is a way to prevent shorting of electrically conductive components and to provide for safe removal of such components when necessary.

DETAILED DESCRIPTION OF A PREFERRED EMBODIMENT

Figure 1:
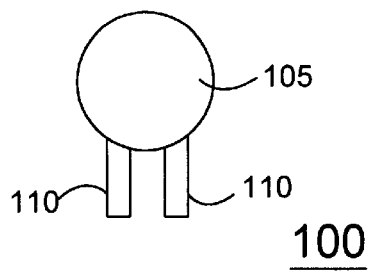
FIG. 1 is a conventional electronic device, such as a positive temperature coefficient (PTC) device.

FIG. 1 shows an electronic component 100, such as a resistor, a diode, a capacitor, a positive temperature coefficient (PTC) device, or any other component that has electrically conductive surfaces or that may heat up during operation. As shown, the component 100 includes a body 105 as well as terminals 110 extending from the body 105 in a conventional manner.

When the component 100 is one that has electrically conductive surfaces, as do many PTC devices, care must be taken to mount the component 100 away from other electrically conductive surfaces in any electrical equipment that incorporates the component 100. Additionally, if the component 100 becomes hot during operation, it could burn a human operator or cause malfunctions in other devices that are in proximity with the component 100.

Figure 2:
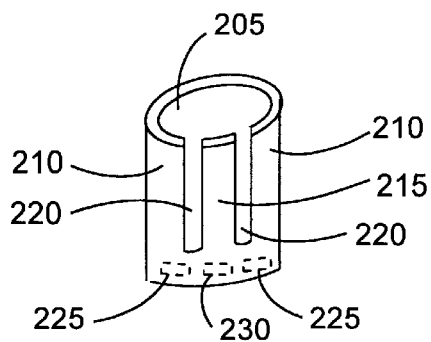
FIG 2 is a perspective view of an insulative holder for holding an electronic device in accordance with the present invention.

Referring next to FIG. 2, a perspective view of an insulative holder 200 according to the present invention is shown. The holder 200 includes a cavity 205 into which an electronic component, such as the component 100, can be inserted so that the holder 200 provides both thermal and electrical insulation. The holder 200 includes at least two apertures 225 formed in a bottom surface of the holder 200 so that terminals or leads of the component can extend through the holder 200 for electrical connection to other circuitry, and another aperture 230 can also be formed for dissipating heat and/or providing access to a surface of the component to help remove it from the holder 200 when necessary.

According to a preferred embodiment of the present invention, the holder 200 comprises sidewalls 210 that partially surround a component that has been inserted into the cavity, openings 220 adjacent to the sidewalls 210 for permitting access to surfaces of the component and for dissipating heat, and a cantilever beam 215. The beam 215 normally presses against the component to hold it within the holder 200 and can be flexed away from the component to permit its removal from the holder 200. Preferably, the body of the holder 200 is integrally formed from a plastic or other insulative material.

Figure 3:
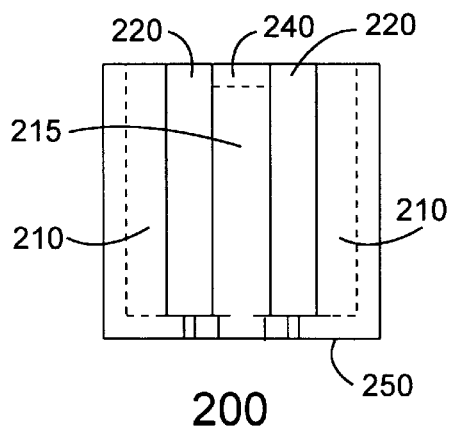
FIG. 3 is a front view of the insulative holder of FIG. 2 in accordance with the present invention
Figure 4:
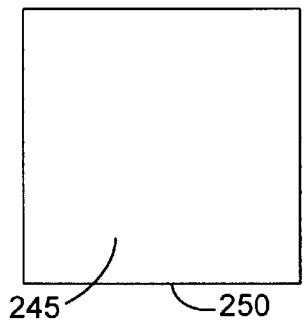
FIG. 4 is a back view of the insulative holder of FIG. 2 in accordance with the present invention.
Figure 5:
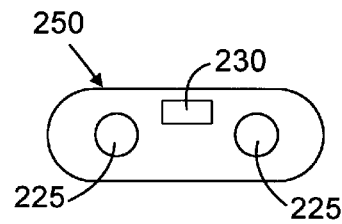
FIG. 5 is a bottom view of the insulative holder of FIG. 2 in accordance with the present invention.

FIGS. 3, 4, and 5 show front, back, and bottom views, respectively, of the holder 200 in its preferred embodiment. Dashed lines illustrative of interior surfaces have been removed from FIGS. 4 and 5 so that they are more comprehensible to the reader. As shown, the back surface 245 preferably includes no openings or apertures, although it will be appreciated that openings and/or apertures could be provided, if desired, to provide additional heat dissipation or to provide other access points to the component. It will be further appreciated that a fewer or a greater number of apertures 225 could be provided for component leads, as required by the component configuration. For example, if the component to be inserted into the holder 200 is a transistor, three apertures 225 could be provided.

Figure 6:
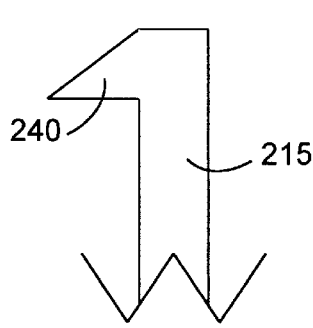
FIG. 6 is a side view of a cantilever beam of the insulative holder of FIG. 2 in accordance with the present invention.

FIG. 6 shows a side, cutaway view of the cantilever beam 215, which includes a lower end coupled to the bottom surface 250 of the holder 200. At its upper end, the beam 215 preferably includes a retaining feature, such as a ledge 240, formed on its interior surface, i.e., the surface of the beam 215 that faces the cavity 205. When the component is inserted into the holder 200, the ledge 240 engages a top surface of the component to retain the component within the cavity 205.

Figure 7:
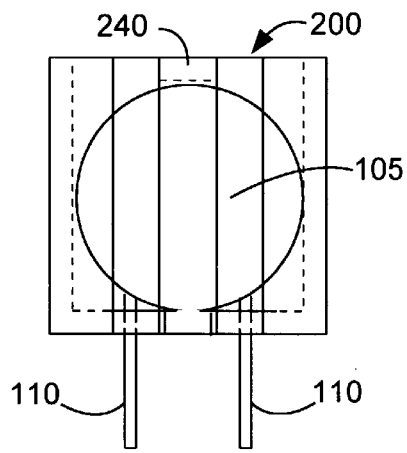
FIG. 7 is a an illustration of the insulative holder of FIG. 2 having an electronic device held thereby in accordance with the present invention.

FIG. 7 illustrates the holder 200 once a component, such as the conventional component 100, has been inserted within the cavity 205. As can be seen, the body portion 105 of the component 100 rests on the bottom surface 250 of the holder 200 and is retained by the retaining feature 240 of the beam 215. The sidewalls 210, which extend from the back of the holder 200 around the side surfaces and front of the holder 200, the bottom surface 250, and the beam 215 all serve to prevent contact with the body portion 105 of the component 100, thereby protecting a human operator from burns. Additionally, other components are prevented from electrically or thermally contacting the component 100, which may be thermally and electrically hot.

Figure 8:
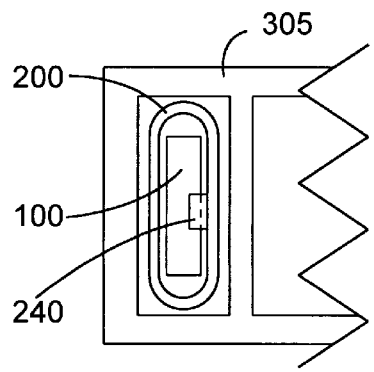
FIG 8 is a top view of electrical equipment having the insulative holder of FIG. 2 and electronic device mounted therein in accordance with the present invention.

FIG. 8 is a top view of the holder 200, including the component 100 mounted therein, after mounting in electrical equipment 305, such as an amplifier, tap, or other communication device. It can be seen that the holder 200 serves a beneficial purpose in preventing both electrical and thermal contact between the component 100 and other electrical equipment components, such as cooling fins, shielding elements, and other metallic members.

It will be appreciated that the holder of the present invention can be formed in different configurations to accommodate different styles of component bodies. For instance, a holder for a cylindrical resistor could be formed into an elongated, trough shape with apertures for the resistor leads at opposing ends of the holder body. The means for retaining the component within the holder could also be different. By way of example, retaining features could include a lid snapped onto the holder or terminal apertures formed to retain the terminals, or the retaining function could be accomplished by providing a pressure fit between the component and the holder. One of ordinary skill in the art will also understand that, although desirable from a manufacturing standpoint, there is no need for the sidewalls, cantilever beam, bottom surface, and any other holder parts to be integrally formed.

What is claimed is:

1. A holder for holding an electronic component that can be inserted into and removed from the holder, the electronic component including terminals and a component body having a height, the holder comprising:
   an insulative body molded to form a cavity into which the electronic component can be inserted, the insulative body including:
      sidewalls formed to partially enclose the electronic component when it is inserted into the holder, the sidewalls are of greater height than the height of the component body of the component; and
      a bottom surface formed perpendicularly with the sidewalls, the bottom surface defining at least two apertures through which the terminals of the electronic component can extends
      wherein the sidewalls define an opening at their upper ends through which the electronic component is inserted into and removed from the holder.

2. The holder of claim 1, wherein:
   the sidewalls extend partially around the electronic component; and
   the holder further comprises a cantilever beam located between the sidewalls and extending perpendiculary upwards from the bottom surface for a distance greater than the height of the component body, the cantilever beam including a ledge for overlapping a top surface of the electronic component and thereby retaining the electronic component within the holder, wherein the cantilever beam can be flexed in a direction away from the electronic component to disengage the ledge from the top surface of the electronic component, thereby permitting removal of the electronic component from the holder.

3. The holder of claim 1, wherein:
   the bottom surface defines two apertures through which the terminals of the electronic component can extend and an additional aperture for dissipating heat generated by the electronic component.

4. The holder of claim 1, wherein the sidewalls and the bottom surface are integrally formed from plastic.

5. The holder of claim 2, wherein the cantilever beam includes an upper end on which the ledge is formed and a lower end integrally formed with the bottom surface, and wherein the cantilever beam can be flexed at its upper end to permit removal of the electronic component from the holder.

6. A holder for holding an electronic component that can be inserted into and removed from the holder, the electronic component including terminals and a component body having a height, the holder comprising:
   an insulative body molded to form a cavity into which the electronic component can be inserted, the insulative body including:
      sidewalls formed to extend partially around the electronic component when it is inserted into the holder, the sidewalls are of greater height than the height of the component body;
      a bottom surface formed perpendicularly with the sidewalls, the bottom surface defining at least two apertures through which the terminals of the electronic component can extend; and
      a cantilever beam located between the sidewalls and extending perpendicularly upwards from the bottom surface for a distance greater than the height of the component body the cantilever beam including a ledge for overlapping a top surface of the electronic component and thereby retaining the electronic component within the holder, wherein the cantilever beam can be flexed in a direction away from the electronic component to disengage the ledge from the top surface of the electronic component thereby permitting removal of the electronic component from the holder.

7. The holder of claim 6, wherein the sidewalls, the bottom surface, and the cantilever beam are integrally formed.

8. The holder of claim 6, wherein the insulative body comprises plastic.

9. Electrical equipment for processing electrical signals, the electronic equipment comprising:
   an electronic component for receiving the electrical signals, the electronic component including terminals and a component body having a height; and
   a holder for holding the electronic component, which can be inserted into and removed from the holder, the holder comprising:
      an insulative body molded to form a cavity into which the electronic component is inserted, the insulative body including:
         sidewalls formed to partially enclose the electronic component when it is inserted into the holder, the sidewalls are of greater height than the height of the component body; and
         a bottom surface formed perpendicularly with the sidewalls, the bottom surface defining at least two apertures through which the terminals of the electronic component extend when the electronic component is inserted into the holder,
      wherein the sidewalls define an opening at their upper ends through which the electronic component is inserted into and removed from the holder.

10. The electrical equipment of claim 9, wherein:
   the sidewalls of the holder extend partially around the electronic component; and
   the holder further comprises a cantilever beam located between the sidewalls and extending perpendicularly upwards from the bottom surface for a distance greater than the height of the component body, the cantilever beam including a ledge for overlapping a top surface of the electronic component and thereby retaining the electronic component within the holder, wherein the cantilever beam can be flexed in a direction away from the electronic component to disengage the ledge from the top surface of the electronic component, thereby permitting removal of the electronic component from the holder.

11. The electrical equipment of claim 9, wherein:

the bottom surface of the holder defines two apertures through which the terminals of the electronic component can extend and an additional aperture for dissipating heat generated by the electronic component.

12. The electrical equipment of claim 9, wherein the sidewalls and the bottom surface are integrally formed from plastic.

13. The electrical equipment of claim 10, wherein the cantilever beam of the holder includes an upper end on which the ledge is formed and a lower end integrally formed with the bottom surface, and wherein the cantilever beam can be flexed at its upper end to permit removal of the electronic component from the holder.

14. The electrical equipment of claim 9, wherein the electronic component comprises a positive temperature coefficient device.

15. The electrical equipment of claim 9, wherein surfaces of the electronic component are electrically conductive.

16. The electrical equipment of claim 9, wherein the electronic component is a positive temperature coefficient device.

17. The electrical equipment of claim 9, further comprising:

electrically conductive members situated adjacent the electronic component, wherein the holder prevents electrical contact between the electronic component and the electrically conductive members.

18. The electrical equipment of claim 17, wherein the electrically conductive members are formed from metal.

* * * * *

UNITED STATES PATENT AND TRADEMARK OFFICE
CERTIFICATE OF CORRECTION

PATENT NO. : 6,147,310
DATED : November 14, 2000
INVENTOR(S) : Mahoney

It is certified that error appears in the above-identified patent and that said Letters Patent is hereby corrected as shown below:

Column 3, Line 38, delete "extends" and insert therefore --extend--

Column 3, Line 47, delete "perpendiculary" and insert therefore --perpendicularly--

Signed and Sealed this

First Day of May, 2001

Attest:

NICHOLAS P. GODICI

Attesting Officer

Acting Director of the United States Patent and Trademark Office